June 4, 1968 J. C. MARINACE 3,387,230

STRESS MODULATION OF RECOMBINATION RADIATION IN SEMICONDUCTOR DEVICES

Filed Oct. 30, 1962 2 Sheets-Sheet 1

CLASS A SEMICONDUCTOR

CLASS B SEMICONDUCTOR

N-TYPE SEMICONDUCTOR

P-TYPE SEMICONDUCTOR

INVENTOR.
JOHN C. MARINACE

BY Bernard N. Wiener

ATTORNEY 3,387,230

STRESS MODULATION OF RECOMBINATION RADIATION IN SEMICONDUCTOR DEVICES

John C. Marinace, Yorktown Heights, N.Y., assignor to International Business Machines Corporation, New York, N.Y., a corporation of New York Filed Oct. 30, 1962, Ser. No. 234,154
10 Claims. (Cl. 332—7.51)

This invention relates generally to modulation of electromagnetic radiation in a solid state device, and it relates more particularly to stress modulation of recombination radiation in a region of a semiconductor element through which it is propagating.

The art of solid-state devices for producing optical energy is developing at a rapid pace. There is need for a technique for readily modulating such optical energy. This invention provides such a technique.

In the practice of this invention, modulation of electromagnetic radiation is obtained selectively by stressing elastically a region of a semiconductor element through which it is propagating. An explanation of the operation of the invention is postulated on the basis of the band theory of the energy structure of semiconductor crystals. Analysis of the data from one class of prior art experiments reveals that stress applied to a region of a semiconductor element changes the width of its forbidden band. Analysis of the data from another class of prior art experiments reveals that the degree of absorption of electromagnetic radiation in a region of a semiconductor element through which it is propagating is related to the width of its forbidden band. Accordingly, it is believed that stress applied to a region of a semiconductor element in accordance with this invention changes the degree of absorption of electromagnetic radiation propagating therein. There is a larger probability that a quantum of light will be absorbed in a semiconductor crystal whose forbidden band width is smaller than the energy of the quantum than if it is larger. Illustratively, if the application of stress to a semiconductor element causes absorption of light which would otherwise have passed through, the stress is considered to have made the width of the forbidden energy band smaller than it was in the absence of the stress, and vice-versa.

Certain prior art experiments have provided evidence that highly efficient recombination radiation is obtainable from certain gallium-arsenide, GaAs, junctions. In view of the band theory of the energy structure of semiconductor crystals, it is believed that the source of the radiation is within the forbidden band where there is a donor impurity level close to the edge of the conduction band and an acceptor impurity level close to the edge of the valence band. As the bulk of the gallium-arsenide semiconductor crystal through which the recombination radiation propagates to the surface does not have these levels, it is believed that the width of the forbidden band therein is too large for significant attenuation of the radiation.

The noted band theory of the energy structure of semiconductor crystals contemplates a forbidden energy band within each crystal between a valence energy band and a conduction energy band. These bands are indicative of the available energy states for electrons. However, they do not indicate whether electrons of these energies are present. The probability for an electron with a given energy being in a particular state is related to the nature of the crystal and its temperature.

A junction is established in a semiconductor crystal in a planar region thereof if there is a relative concentration of n-type donor impurity atoms on one side of the plane and there is a relative concentration of p-type acceptor impurity atoms on the other side of the plane. Conduction of electrons and holes occurs across a semiconductor junction as result of an application of an external potential. When the polarity of the applied potential is such as to reduce the barrier potential established by the junction itself, the conduction is relatively high, and vice-versa. Whenever charge conduction occurs across a semiconductor junction, energy is liberated as result of the process. The energy may be manifested as heat energy in the form of electron and crystal lattice motion or it may be manifested as recombination radiation. Generally, a quantum of the recombination radiation possesses an energy equal to the energy spacing between the electron and hole which recombined. Under some circumstances, some of the energy will be dissipated as heat and the quantum will to that extent have less energy.

This invention is utilized advantageously for modulating the collector current of an electro-optical transistor. The prior art electro-optical transistor described herein is described and claimed by the inventors thereof in the heterojunction form in U.S. patent application Ser. No. 237,501 by F. Fang et al., filed Nov. 14, 1962, and in the homojunction form in U.S. patent application Ser. No. 239,434 by R. F. Rutz, filed Nov. 23, 1962; these patent applications are assigned to the assignee hereof. Such a transistor utilizes photon injection to the collector junction. Electron-hole pairs are produced at the junction by absorption of the photons and are separated by the electric field thereat, under the force of applied potential. The photons are generated by recombination of electron-hole pairs at another junction in the transistor. In the practice of this invention, a region of the transistor in which the photons are propagating, is selectively stressed elastically, thereby modulating the collector current.

The following reference presents background information on the relationship between applied stress and the nature of the forbidden band in a semiconductor material:

"Band Structure of the Intermetallic Semiconductor From Pressure Experiments," W. Paul, Journal of Applied Physics, Supplement to vol. 32, No. 10, October 1961, pp. 2082–2094.

The following references present background information on the relationship between recombination radiation at a semiconductor junction and the nature of the forbidden energy band in the semiconductor:

(a) "Injection Luminescence From Gallium Arsenide," J. I. Pankove and M. J. Massoulie, Bulletin of the American Physical Society, vol. 7, January 1962, p. 88.

(b) "Recombination Radiation Emitted by Gallium Arsenide," R. J. Keyes and T. M. Quist, Proceedings of the IRE, vol. 50, August 1962, pp. 1822–1823.

A background text of general interest is "Photoconductivity in the Elements," T. S. Moss, Academic Press, Inc., 1952.

It is a primary object of this invention to provide apparatus and method for modulating electromagnetic radiation by selectively stressing elastically a region of a semiconductor element through which it is propagating.

It is a second object of this invention to provide apparatus and method for modulating recombination radiation generated at a junction in a semiconductor element by selectively stressing elastically an adjacent region therein through which it is propagating.

It is a third object of this invention to provide apparatus and method for modulating recombination radiation generated at a p-n junction in a gallium-arsenide semiconductor element by selectively stressing elastically an adjacent region therein through which it is propagating.

It is a fourth object of this invention to provide apparatus and method for modulating recombination radiation generated at a p-n junction in a semiconductor element by selectively stressing elastically a region of the element near its surface through which the radiation is propagating.

It is a fifth object of this invention to provide apparatus and method for selectively absorbing recombination radiation generated at a p-n junction in a semiconductor element by selectively stressing elastically an adjacent region therein. Impurities are selectively established in the adjacent region that cause electron-hole pairs generated by the absorption of the radiation to recombine by radiationless processes.

It is a sixth object of this invention to provide apparatus and method for modulating recombination radiation from a semiconductor element p-n junction by selectively stressing elastically an adjacent region through which it is propagating. Impurities are established in the adjacent region with levels within the forbidden band which are somewhat farther from the band edges than the the comparable levels within the forbidden band at the radiating junction, thereby reducing absorption of radiation propagating through the adjacent region.

It is a seventh object of this invention to provide a transducer whereby modulated acoustic energy is converted to modulated optical energy. It is an eighth object of this invention to provide a transducer in which modulated acoustic energy is converted to modulated optical energy by selectively stressing elastically a region in a semiconductor element through which recombination radiation generated at a p-n junction in the semiconductor is propagating.

It is a ninth object of this invention to provide a transducer in which modulated acoustic energy is converted to modulated optical energy by selectively stressing elastically a homojunction collector in an electro-optical transistor.

It is a tenth object of this invention to provide apparatus and method for modulating collector current of an electro-optical transistor by selectively stressing elastically a region therein.

It is an eleventh object of this invention to provide apparatus and method for modulating collector current of an electro-optical transistor which employs a Ge-GaAs heterojunction by selectively stressing elastically the region of the transistor through which photons are propagating to the collector.

It is a twelfth object of this invention to provide apparatus and method for modulating recombination radiation resultant from stimulated emission at a p-n semiconductor junction.

The foregoing and other objects, features and advantages of the invention will be apparent from the following more particular description of preferred embodiments of the invention, as illustrated in the accompanying drawings.

Figure 4A:
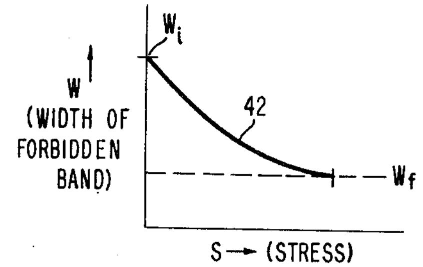

FIGURE 4*a* is a graphical representation of the relationship between the width of the forbidden band to applied stress for a class A semiconductor element.

Figure 4B:
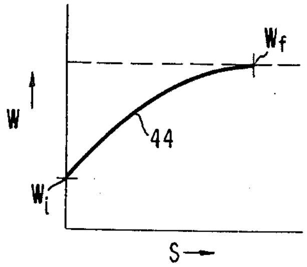

FIGURE 4*b* is a graphical representation of the relationship between the width of the forbidden band to applied stress for a class B semiconductor element.

Figure 5A:
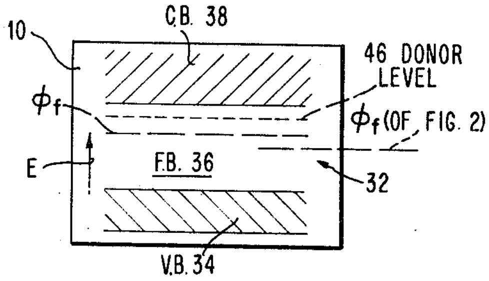

FIGURE 5*a* illustrates the band structure of an n-type semiconductor showing the presence of a donor energy level as result of the presence of donor impurity atoms in the semiconductor.

Figure 5B:
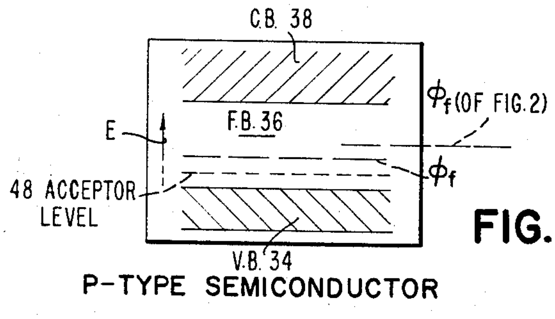

FIGURE 5*b* illustrates the band structure of a p-type semiconductor showing the presence of an acceptor energy level as result of the presence of acceptor impurity atoms in the semiconductor.

Figure 6:
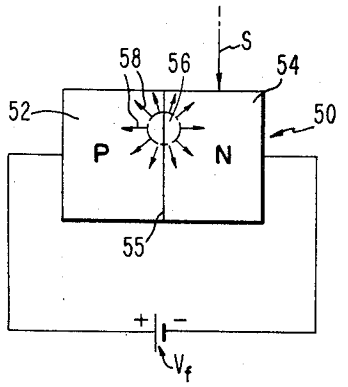

FIGURE 6 illustrates the recombination radiation emanating from p-n junction in semiconductor element when the junction is forward biased.

Figure 7:
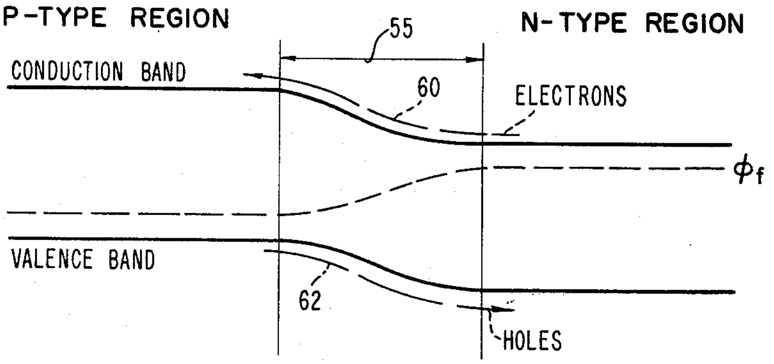

FIGURE 7 is a graphical representation of the band structure of a forward biased p-n semiconductor junction showing the movement of electrons and holes across the junction.

Figure 8:
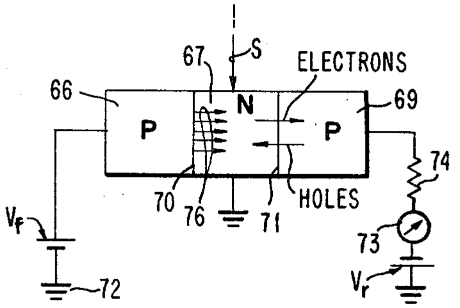

FIGURE 8 illustrates an electro-optical transistor in which recombination radiation consisting of photons which is propagating to the collector junction is modulated by the application of stress to a region in which it is propagating, thereby modulating the collector current.

Figure 9:
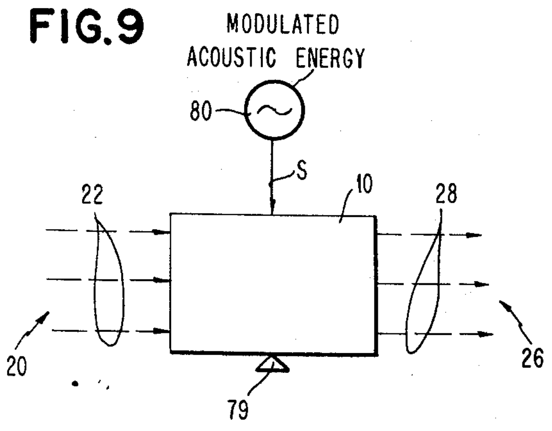

FIGURE 9 illustrates a transducer for converting modulated acoustic energy to modulated optical energy.

Figure 10:
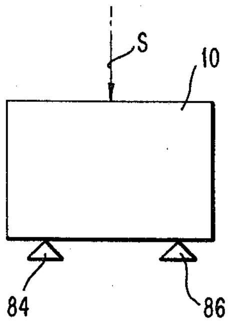

FIGURE 10 illustrates a semiconductor element with bending stress applied thereto, for the purpose of modulating electromagnetic radiation propagating therein.

Generally, the practice of this invention obtains modulation of radiation by selectively stressing elastically a region of a solid state device through which it is propagating. More particularly, it obtains modulation of recombination radiation emanating from a p-n junction in a semiconductor element by selectively stressing elastically an adjacent region therein through which it is propagating. Specifically, it obtains modulation of recombination radiation emanating from a gallium-arsenide p-n junction in a semiconductor element by selectively stressing elastically an adjacent region through which it is propagating.

Figure 1:
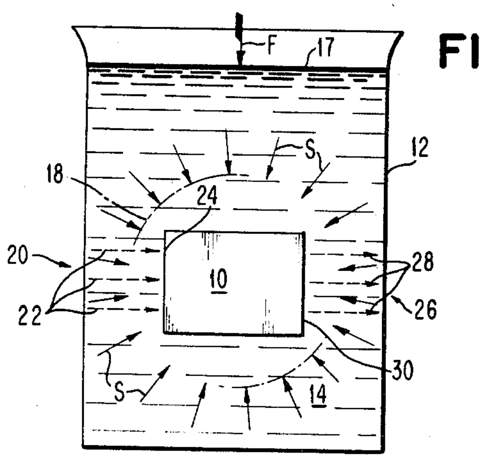
FIGURE 1 illustrates apparatus for applying hydraulic pressure to a region of semiconductor element through which electromagnetic radiation is propagating.

The general nature of the invention will be understood through reference to the figures. In FIG. 1 a semiconductor element 10 is established in a chamber 12. A fluid 14 is present in chamber 12. Hydraulic pressure is established in fluid 14 of chamber 12 under application of force F on piston 17. In this manner, a uniform pressure is established in fluid 14 and a uniform stress applied to semiconductor element 10. The stress in semiconductor element 10 is illustrated as stress vectors S applied to the periphery of imaginary circle 18. Electromagnetic radiation 20 with quanta 22 is shown propagating into surface 24 of semiconductor element 10. Electromagnetic radiation 26 having quanta 28 is shown propagating from surface 30 of semiconductor element 10. The practice of the invention involves modulation of the output electromagnetic radiation from semiconductor element 10 by selectively applying force F to piston 17, thereby altering concomitantly the stress S applied to semiconductor element 10. The physical mechanism whereby the radiation 20 is modulated within semiconductor element 10 will be explained in terms of the band theory of the energy structure of semiconductor crystals.

Figure 2:
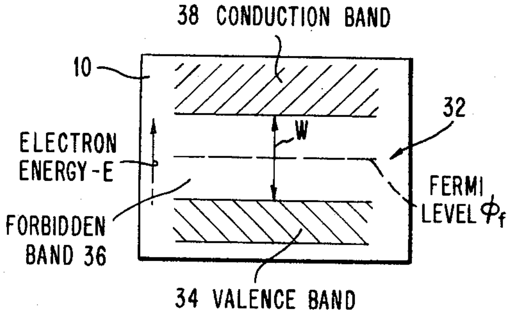
FIGURE 2 illustrates the energy band structure of a semiconductor crystal.
Figure 3:
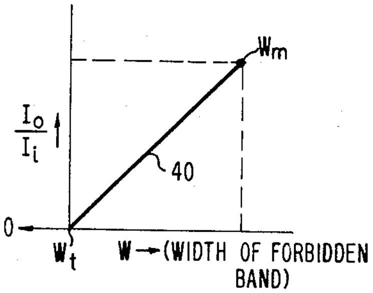
FIGURE 3 is a graphical representation of the relationship between the ratio of the intensities of input rediation and output radiation and the width of the forbidden band of a semiconductor region through which the radiation is propagating.

In FIG. 2 a semiconductor element 10 is shown with its band structure 32 established within the boundaries thereof for illustrative purpose. The vertical axis represents the electron energy E. The band structure includes a valence band 34, a forbidden band 36, and a conduction band 38. A Fermi-level $\phi_f$ is located within the forbidden region. The energy gap width of the forbidden region is indicated by two-way arrow W. The functional relationship between the width of the forbidden region and the amount of radiation propagating from surface 30 will be understood through reference to FIG. 3. In FIG. 3, the vertical axis represents the ratio $I_o/I_1$ of the intensity $I_o$ of the output radiation 26 to the intensity $I_1$ of the input radiation 20; and the horizontal axis is indicative of the width W of the forbidden region. The curve 40 is a plot of $I_o/I_1$ vs. W. The exact nature of the curve 40 for any particular semiconductor element is readily obtained by conventional experimental technique. In accordance with FIG. 3, it will be understood that there is a threshold width $W_t$ of the forbidden band below which no radiation is propagated from surface 30 of semiconductor element 10; and a maximum width $W_m$ of the forbidden band above which all electromagnetic radiation 20 propagating into surface 24 of semiconductor element 10 propagates from surface 30. It has been determined that there are two classes A and B of semiconductor elements in terms of the effect of applied stress on the width of their respective forbidden bands. In class A semiconductor elements applied stress causes the width W of the forbidden region to become smaller, whereas in class B, semiconductor elements the applied stress causes the width W of the forbidden region to become larger. For illustrative purpose, FIG. *4a* is a graph of the width of the forbidden band vs. the applied stress for class A semiconductors; and FIG. *4b* is a graph of the width of the forbidden band vs. applied stress for class B semiconductors. In FIG. *4a,* it is seen that the width W of the forbidden band vs. applied stress S is a curve which starts on the W axis at a value $W_i$ and terminates at a value $W_f$. The change in W between $W_i$ and $W_f$ results from elastic deformation of the crystal. In FIG. *4b*, the curve 44 indicates the effect of stress S on the width W of the forbidden band in a class B semiconductor. It is seen that the initial width $W_i$ rises to a higher value width $W_f$ with increased stress. Illustrative of class A semiconductors are aluminum-antimonide, AlSb, and gallium-phosphide, GaP; and illustrative of class B semiconductor elements are gallium-arsenide GaAs, and germanium, Ge. The practice of the invention as it relates to use of impurity elements to aid the effect of applied stress on the modulation of electromagnetic radiation propagating in a semiconductor element will be understood through reference to FIGS. *5a* and *5b* which show the effect of the addition of donor and acceptor elements, respectively. In FIG. *5a*, the semiconductor element 10 is doped with donor impurity elements, thereby obtaining an n-type semiconductor. The band structure is patterned after the illustration of FIG. 2. As result of donor elements in the semiconductor crystal lattice there is a donor level 46 within the forbidden band, and the Fermi-level $\phi_f$ is raised somewhat towards the conduction band edge. In FIG. *5b*, there is illustrated the effect of the presence of acceptor impurity elements in the semiconductor crystal lattice, thereby obtaining a p-type semiconductor. There is in addition to the band structure 32 of FIG. 2, an acceptor hole energy level 48 within the forbidden band. The Fermi-level has moved somewhat closer to the valance band edge.

FIG. 6 illustrates the generation of recombination radiation at a p-n junction of a forward biased semiconductor element. A semiconductor element 50 has a p-type region 52 and an n-type region 54, with a p-n junction 55 therebetween. The positive terminal of a potential source $V_f$ is shown connected to the p-type region 52 and its negative terminal is shown connected to the n-type region 54, thereby forward biasing semiconductor element 50. An illustrative region 56 of the p-n junction is shown in circular form. Emanating from region 56 is light 58, represented by arrows. Stress S applied to n-type region 54 causes modulation of the light 58.

The general nature of the band structure in a semiconductor element 50 (FIG. 6) with p-n junction 55 therein is illustrated in FIG. 7. Characteristically, electrons flow from the n-type region to the p-type region as indicated by arrow 60 and holes flow from the p-type region to the n-type region as indicated by arrow 62.

FIG. 8 is illustrative of an electro-optical transistor utilized in the practice of this invention. Transistor 64 has a p-type region 66, n-type region 67 and p-type region 69. Junction 70 is between regions 66 and 67. Junction 71 is between regions 67 and 69. The positive terminal of potential source $V_f$ is connected to p-type region 66 and its negative terminal is connected to ground 72. The negative terminal of voltage source $V_f$ is connected via current meter 73 and load resistor 74 to p-type region 69. Its positive terminal is connected to ground. n-Type region 67 is connected to ground. Recombination radiation 76 emanating from p-n junction 70 causes electron-hole pairs at n-p junction 71. By application of stress S to n-type region 67, the recombination radiation propagating therein is modulated and the collector current flowing in load resistor 74 as indicated by meter 73 is also modulated.

FIG. 9 illustrates an acoustic-optical transducer in accordance with this invention. A semiconductor region 10 supported on support means 79 into which is propagating electromagnetic radiation 20 with quanta 22 and out of which is propagating electromagnetic radiation 26 with quanta 28 is stress S modulated in a region thereof by acoustic energy 80. As a consequence, the output intensity $I_0$ of radiation 28 is modulated by elastic deformation of semiconductor element 10 in accordance with the acoustic energy 80.

FIG. 10 is illustrative of a technique for stress modulating a semiconductor element 10. The element 10 is shown supported by fulcrums 84 and 86. Stress S is applied to an opposite surface from the fulcrums to cause element 10 to have a bending moment. In this manner, elastic deformation in accordance with the stress S is applied to semiconductor element 10 to modulate electromagnetic radiation propagating therein.

The practice of this invention will now be described with reference to the figures.

In FIG. 1, the electromagnetic radiation entering surface 24 of semiconductor element 10 is modulated therein by the application of the stress S. As shown in FIGS. *4a* and *4b*, the effect of stress is different dependent upon whether the semiconductor element is class A or Class B. Since the change in the width W of the forbidden band of a region of semiconductor element (FIG. 3) changes the amount of absorption of the electromagnetic radiation propagating therein, inquiry is now made as to the effect of the stress on both amplitude and frequency of the output radiation 26. In the event that the incoming radiation 20 is monochromatic, i.e., has a single frequency at junction 55 (FIG. 6), e.g., from stimulated emission, when the forbidden band width W is made smaller, the output radiation 28 remains monochromatic but has a smaller intensity amplitude. Intensity is considered herein to indicate the energy of electromagnetic radiation propagating through a unit cross-section. In the event that the incoming radiation 20 is polychromatic, and if the application of stress S causes the forbidden band width W to become smaller, the radiation propagating from surface 30 is changed both as to its intensity amplitude and as to its frequency content. The energy of an electromagnetic radiation photon is directly proportional to its frequency. Accordingly, as the width W of the forbidden band becomes smaller, higher frequencies in the incoming radiation 20 are preferentially absorbed. Thus, in circumstance of polychromatic input radiation 20, the output radiation 26 has less intensity and its frequency content distribution is different than that of the incoming radiation. Since stress S is applied to semiconductor element 10 elastically in accordance with this invention, the process of making the width W of the forbidden band either smaller or larger is reversible. With reference to FIG. 3, graph 40 of $I_0/I_1$ vs. W may not be linear. A determination is made by a conventional experimental technique of the range over which the width W of the forbidden band is to be varied in accordance with the modulation characteristics desired for the output radiation 26. Since electrons in a semiconductor element will be present in the available states (FIG. 2) in the band structure in a manner related to the temperature of the element, concern must be given in the practice of this invention of the temperature of the element. For example, the fluid 14 in chamber 16 of FIG. 1 may readily be controlled in temperature in accordance with conventional experimental techniques.

The apparatus of FIG. 1 whereby stress S is applied to a semiconductor element is merely exemplary of many conventional techniques for applying stress to an object. In all instances where the semiconductor element 10 has a medium present either on its input surface 24 or its output surface 30, the optical characteristics of the medium must be selected so that the radiation is propagated to its objective in accordance with the use of the invention.

In the practice of this invention, it is sometimes desirable to establish certain impurity elements in a region of a semiconductor which is being selectively stressed elastically: in order to modulate electromagnetic radiation propagating therein, in accordance with properties of the impurity elements. With reference to FIGS. *5a* and *5b*, it is observed that donor energy levels and acceptor energy levels may be established in the forbidden band of a semiconductor element by selectively doping the element with preferred amounts of n-type and p-type impurities. In this manner, there will be present electron and hole levels to aid in dissipating radiationless processes rather than recombination radiation, the radiation which was previously absorbed. Consider the special case of class B semiconductors in which impurity elements are preferentially established as described above. In such a semiconductor, the absorption of electromagnetic radiation propagating in region is greatest in the absence of applied stress in the region. Since stress causes the forbidden band width of a class B semiconductor to become greater, the use of the impurity elements permits more radiation to propogate through when the stress is applied.

Since the band structure of a crystal is markedly different near a surface thereof than in the adjacent bulk material, application of stress in accordance with this invention in a region near the surface preferentially controls the modulation of radiation propagating through the surface to a greater extent than if applied farther away in the bulk material.

In the practice of this invention, attention is often given to utilizing adjacent regions of both class A and class B semiconductors (FIGS. *4a* and *4b*). In this manner, a desired modulation characteristic of optical energy is obtained.

In the practice of this invention for the purpose of modulating recombination radiation, as illustrated by FIG. 6, it is especially applicable if the recombination radiation 58 results from stimulated emission at junction 55.

Selective application of stress to either the p-type region 52 or the n-type region 54 obtains pulse modulation of the output radiation 26 (FIG. 1) from semiconductor 50. The application of stress selectively in this circumstance lends itself readily to the control of digital information being carried by the output radiation 26.

In view of the band structures of n-type and p-type semiconductors illustrated in FIGS. *5a* and *5b*, respectively, the source of the highly efficient recombination radiation from (FIG. 6) a gallium-arsenide, GaAs, semiconductor junction 55 may be within the forbidden band. In explanation, recombination transitions may be occurring between a donor level and an acceptor level. By preferentially doping the p-type region or n-type region of semiconductor element 50, donor and acceptor levels are preferentially established therein. Since gallium-arsenide is a class B semiconductor, the width of its forbidden band increases with the application of stress. Therefore, by the preferential doping of a region thereof through which the recombination radiation is propagating, the amount of absorption in the absence of the stress is carefully determined. By the selective application of the stress, a desired modulation of the output optical energy is obtained. Illustratively, if recombination radiation in gallium-arsenide occurs in junction 55 approximate the p-type side, as result of electron-hole transitions between donor and acceptor levels within the forbidden band, then, establishing selectively donor and acceptor levels in a portion of the n-type region which tend to absorb the recombination radiation permits stress to cause the radiation to propagate out of the portion. Assume there is uniform donor doping of silicon, Si, throughout the semiconductor crystal 50 (FIG. 6) and acceptor doping of zinc, Zn, in the p-type region 52 (the zinc having a higher concentration than the silicon in the p-type region). Then zinc is doped into the stress field portion of the n-type region 54 in about the same concentration as the silicon therein to obtain the desired absorption in the absence of stress.

The practice of this invention with electro-optical transistor technology will be described with reference to FIG. 8. As described above, the recombination radiation 76 emanating from the junction 70 causes the generation of electron-hole pairs at junction 71. By the application of stress to n-type region 67, the recombination radiation propagating therein is modulated. It will be readily understandable to those skilled in the art that the stress S may be selectively applied to the n-type region 67 in a manner to modulate the collector current flowing in resistor 74 in accordance with a desired use thereof.

It has been demonstrated that an electro-optical transistor as presented in FIG. 8 may be obtained if junction 71 is either a heterojunction or a homojunction. As an example of a heterojunction in an electro-optical transistor, the p-type region 66 and n-type region 67 are gallium-arsenide whereas p-type region 69 is germanium. As an example of a homojunction, all the regions of the electro-optical transistor of FIG. 8 are gallium arsenide. By selectively applying the stress S to the region of the junction in both homojunction and heterojunction electro-optical transistors, in accordance with the technology of FIG. 8, desirable modulation of the collector current is obtained.

It is sometimes desirable to dope the immediate environment of a junction like junction 71 in a manner to cause a built-in field to separate electron-hole pairs generated by absorption of photons thereat. In this manner, stress applied to the junction operates more efficiently in modulating the output radiation.

FIGS. 9 and 10 illustrate two techniques for applying stress to a semiconductor element 10. In FIG. 9, modulated acoustic energy is applied to one surface of the semiconductor element 10 which is supported by support means 79.

In FIG. 10, the fulcrum 84 and 86 support semiconductor element 10 on one surface thereof while the stress S applied to another surface causes a bending stress therein. It will be clear to those skilled in the art that various types of stress can be preferentially established in semiconductor elements in accordance with the practice of this invention. Illustratively, tension, compression and torsion stresses may be utilized either singly or in concert.

With reference to FIGS. 2, 6 and 7, the practice of this invention with respect to controlling the stimulated emission at a p-n junction will be described. As the energy of the stimulated emission is related to the width W of the forbidden band, if the radiating junction is selectively stressed elastically, the energy intensity of the resultant recombination radiation from stimulated emission is altered. In the circumstance of a class A semiconductor, stress applied to such a junction causes the recombination radiation resultant from stimulated emission to have a longer wave-length. In the circumstance of a class B semiconductor, the application of stress to such a radiating junction has the effect of shortening the wave-length of the resultant recombination radiation from stimulated emission.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Apparatus for modulating electromagnetic radiation having:

a semiconductor element therein with a surface receptive of such radiation, and
means for selectively stressing elastically a region of said semiconductor element to vary the energy gap thereof to modulate said radiation propagating in said region.

2. Apparatus for modulating electromagnetic radiation having
a semiconductor element therein with a p-n junction,
potential means for causing recombination radiation at said junction,
and stress means for applying stress selectively and elastically to a region of said semiconductor element through which said radiation is propagating to vary the energy gap thereof to modulate said radiation.

3. An acoustic energy to optical energy transducer having:
a semiconductor element with a region through which said optical energy is propagating,
and means for stressing said region selectively and elastically in accordance with said acoustic energy to vary the energy gap thereof to modulate said optical energy.

4. Apparatus for modulating electromagnetic radiation comprising:
a semiconductor region in which said radiation is propagating;
means for maintaining the temperature of said region substantially constant; and
means for stressing said region selectively and elastically to vary the energy gap thereof to modulate said radiation propagating from said region.

5. Apparatus for modulating electromagnetic radiation propagating through a region of a semiconductor comprising:
a semiconductor element having electromagnetic radiation propagating through a region thereof, said region having particular atomic elements therein to cause selective absorption of said radiation by radiationless transitions; and
means for stressing said region of said semiconductor selectively and elastically to vary the energy gap thereof to modulate said radiation propagating from said region.

6. Apparatus for modulating electromagnetic recombination radiation resulting from emission at a p-n junction in a semiconductor comprising:
a semiconductor having a p-n junction therein from which recombination radiation is propagating resultant from emission at said junction; and
means for stressing said semiconductor selectively and elastically in the region of said junction to vary the energy gap thereof to modulate said recombination radiation.

7. Apparatus for modulating recombination radiation emanating from a p-n junction in a semiconductor element comprising:
a semiconductor element having said p-n junction; and
means for stressing selectively and elastically a region in said semiconductor element through which said radiation is propagating to vary the energy gap thereof to modulate said radiation.

8. Apparatus for modulating the collector current of an electro-optical device having:
an electro-optical device including a collector junction therein to which radiation is applied; and
means for applying stress selectively and elastically to a region in said device through which said radiaton is propagating to said junction to vary the energy gap of said region to modulate said collector current of said electro-optical device by modulation of said radiation.

9. Apparatus for enhancing electron-hole pair separation in a semiconductor element comprising:
a semiconductor element with a p-n junction therein having electron-hole pair separation generated by absorption of photons thereat; and
means for stressing selectively and elastically said p-n junction to vary the energy gap thereof to enhance said electron-hole pair separation.

10. Apparatus as set forth in claim 7 wherein said radiation is modulated in amplitude.

References Cited

UNITED STATES PATENTS 3,245,002 4/1966 Hall -------------- 331—94.5

ROY LAKE, *Primary Examiner.*

DARWIN HOSTETTER, *Examiner.*